(12) United States Patent
Schulz

(10) Patent No.: US 7,700,999 B2
(45) Date of Patent: Apr. 20, 2010

(54) SRAM DEVICE

(75) Inventor: Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 264 days.

(21) Appl. No.: 11/773,510

(22) Filed: Jul. 5, 2007

(65) Prior Publication Data

US 2009/0008707 A1 Jan. 8, 2009

(51) Int. Cl.
*H01L 23/62* (2006.01)
(52) U.S. Cl. .............. 257/329; 257/E21.661; 438/329
(58) Field of Classification Search .............. 257/329, 257/E21.661; 438/329
See application file for complete search history.

(56) References Cited

U.S. PATENT DOCUMENTS

| 5,550,396 | A | * | 8/1996 | Tsutsumi | 257/330 |
| 5,831,899 | A | * | 11/1998 | Wang et al. | 365/156 |
| 6,038,164 | A | | 3/2000 | Schulz et al. | |
| 6,472,767 | B1 | * | 10/2002 | Enders et al. | 257/334 |
| 6,670,642 | B2 | * | 12/2003 | Takaura et al. | 257/67 |
| 6,882,007 | B2 | | 4/2005 | Landgraf et al. | |
| 2004/0099902 | A1 | * | 5/2004 | Landgraf et al. | 257/316 |

\* cited by examiner

*Primary Examiner*—Wael Fahmy
*Assistant Examiner*—John C Ingham
(74) *Attorney, Agent, or Firm*—Dicke, Billig & Czaja, PLLC

(57) ABSTRACT

An integrated circuit device has a base area defining a longitudinal axis. Four in-line transistors, which are NMOS transistors in exemplary embodiments, are each centered on the longitudinal axis. Two off-set transistors, which are PMOS transistors in exemplary embodiments, are off-set to first and second sides of the longitudinal axis, respectively.

31 Claims, 12 Drawing Sheets

SRAM DEVICE

BACKGROUND

This disclosure relates generally to integrated circuit semiconductor devices, and more particularly to memory devices.

Conventional silicon microelectronics typically use horizontally formed metal oxide semiconductor field effect transistors (MOSFET), in which the surface of a substrate on or in which the MOSFET is formed is oriented parallel to a gate oxide layer and parallel to a gate electrode arranged on the gate oxide layer. In order to achieve further miniaturization, vertically layered transistors have been formed in which the gate oxide layer is arranged essentially perpendicular to the surface of the substrate on or in which the vertical transistor is formed.

A vertical transistor has the advantage over planar technology in that the vertical transistor has a smaller area requirement in the plane of the substrate. In other words, with vertical transistors it is possible to achieve a higher integration density of transistors per substrate surface than with horizontal transistors. Using transistors of reduced dimension, switching elements with shortened switching times can be achieved since the length of the conductive channel can also be shortened.

One area of application for such transistors is memory devices, such as static random access memory (SRAM) devices and dynamic random access memory (DRAM) devices. DRAM memory cells are essentially made up of a capacitor, and data are stored in the DRAM memory cells in the form of electric charges that need to be periodically refreshed. SRAM memory cells store data using flip-flops, so an SRAM has faster access time as compared to a DRAM, and refreshing memory cells is not required with an SRAM.

A common SRAM memory cell configuration uses six transistors connected between an upper reference potential $V_{DD}$ and a lower reference potential $V_{SS}$ in such a way that one of two storage nodes can be occupied by the information to be stored, with the complementary information stored at the other storage node. In prior implementations, the transistors of the memory cell have been arranged in essentially parallel rows on a generally octagonal or rectangular base area of a substrate. However, such arrangements may not provide an optimum use of substrate area. It is desirable to further reduce the space requirement of an SRAM memory cell on or in a surface region of a substrate.

For these and other reasons, there is a need for the present invention.

SUMMARY

In accordance with aspects of the invention, an integrated circuit device has a base area defining a longitudinal axis. Four in-line transistors, which are NMOS transistors in exemplary embodiments, are each centered on the longitudinal axis. Two off-set transistors, which are PMOS transistors in exemplary embodiments, are off-set to first and second sides of the longitudinal axis, respectively.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
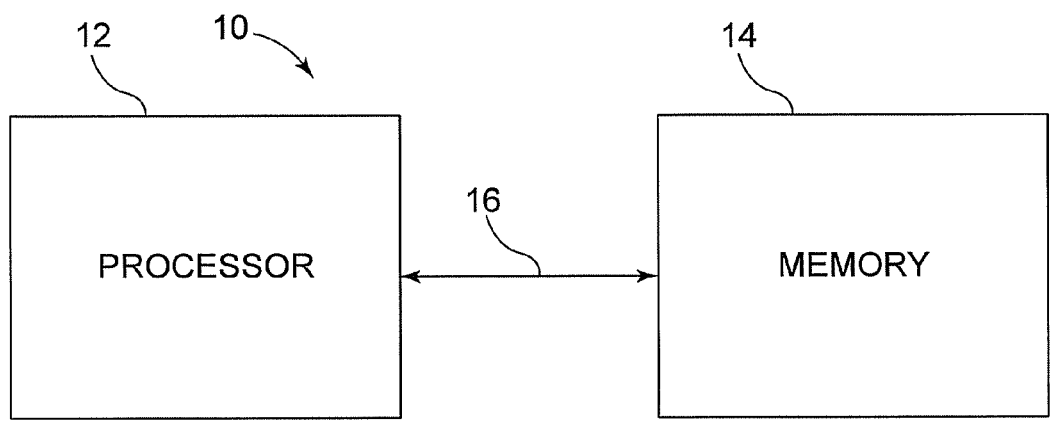
FIG. 1 is a block diagram conceptually illustrating a system in accordance with aspects of the present invention.

FIG. 1 is a high-level block diagram conceptually illustrating a system employing a static random access memory (SRAM) device in accordance with aspects of the present invention. The illustrated system 10 includes a processing device 12, such as microprocessor, connected to memory 14 by a communications interface 16, such as a bus. In many computer systems, such as a typical personal computer system, dynamic random access memory (DRAM) devices are used for the computer's main memory due to their simplicity and low cost. In such systems, SRAMs typically provide cache memory, interfacing with the processor 12 at speeds not attainable by DRAMs. In systems requiring very low power consumption, such as portable electronic devices, SRAMs may be used exclusively to fulfill RAM functions.

Figure 2:
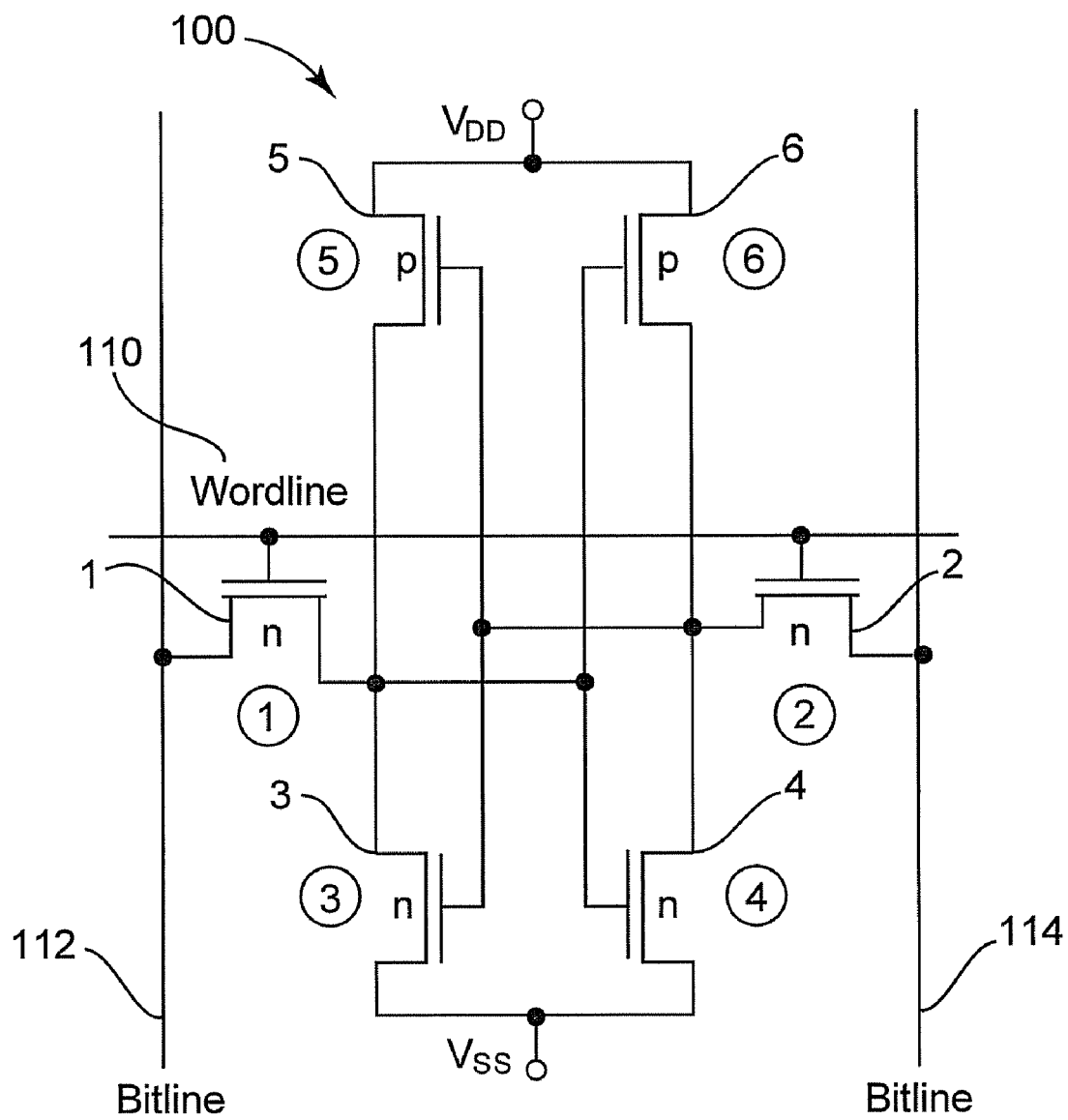
FIG. 2 is a circuit diagram schematically illustrating a six-transistor SRAM memory cell.

FIG. 2 is a circuit diagram schematically illustrating a typical six-transistor SRAM memory cell. Two n-channel metal oxide semiconductor (NMOS) transistors 1, 2 are connected as switching transistors, having gate terminals connected to a word line 110. The remaining transistors are flip-flop transistors for storing data in the SRAM cell 100: two NMOS transistors 3,4 and two p-channel metal oxide semiconductor (PMOS) transistors 5,6 form a latch to store the data, wherein data are passed to and from the latch to complementary bit lines 112, 114 via the switching transistors 1,2 in response to a control signal transmitted via the word line 110. The PMOS flip-flop transistors 5,6 each have one of their source/drain terminals connected to a first voltage source $V_{DD}$, and the NMOS flip-flop transistors 3,4 each have one of their source/drain terminals connected to a second (typically ground potential) voltage source $V_{SS}$.

Figure 3:
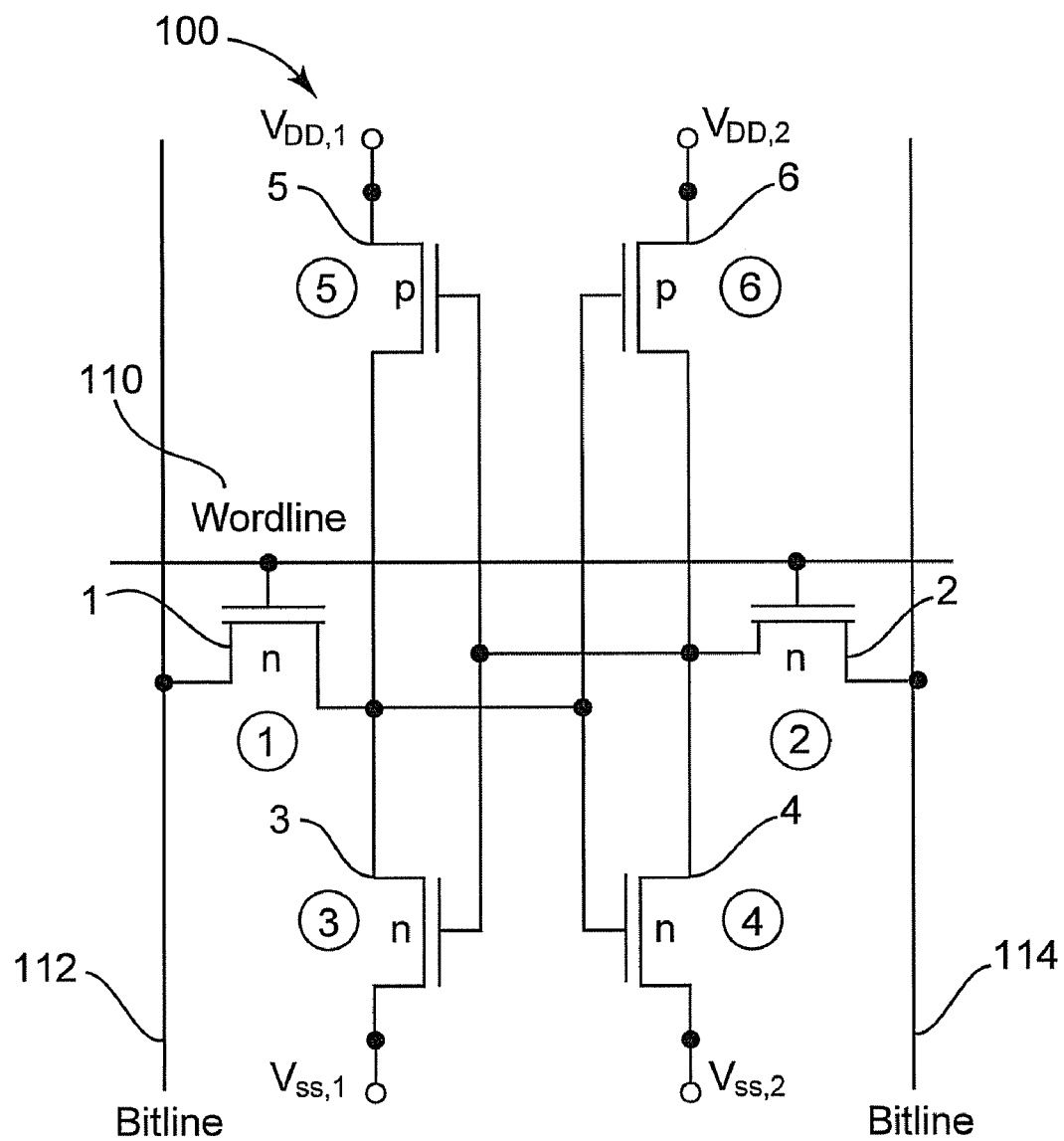
FIG. 3 is a circuit diagram schematically illustrating another six-transistor SRAM memory cell in accordance with embodiments of the invention.

FIG. 3 is a circuit diagram illustrating an SRAM memory cell 100 in accordance with embodiments of the present invention, in which two $V_{DD}$ terminals ($V_{DD,1}$ and $V_{DD,2}$) and two $V_{SS}$ terminals ($V_{SS,1}$ and $V_{SS,2}$) are provided. Among other things, this allows fine-tuning of the memory cell 100, optimizing the voltages applied to each of the flip-flops in the SRAM cell 100.

Figure 4:
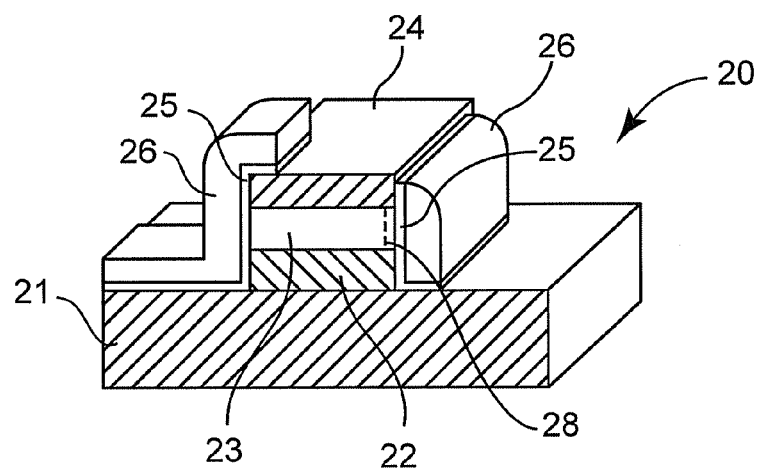
FIG. 4 illustrates a vertical transistor suitable for use in embodiments disclosed herein.

FIG. 4 conceptually illustrates an example of a vertical transistor 20 suitable for use in the SRAM device embodiments disclosed herein. The exemplary vertical transistor 20 includes an n-doped source region 22 which is applied on an n-doped substrate 21. A p-doped intermediate region 23 is applied on the n-doped source region 22 and an n-doped drain region 24 is applied on the p-doped intermediate region 23. Thus, both the source region and the drain region are realized as layers formed generally parallel to the substrate surface. A gate dielectric layer 25 is applied orthogonally with respect to the surface of the n-doped substrate 21, extending in the vertical direction along the n-doped source region 22, the p-doped intermediate region 23 and the n-doped drain region 24. A gate electrode 26 is deposited laterally on the gate dielectric layer 25.

As with conventional horizontally-oriented MOSFETs, an electrically conductive channel 28 is produced between the source region 22 and the drain region 24 by the gate electrode 26 being brought to a suitable electrical potential. This conductive channel 28 enables a current flow between the n-doped source region 22 and the n-doped drain region 24. A vertical transistor such as the transistor 20 uses less area in the plane of the substrate than a horizontal transistor.

Known six-transistor SRAM cells typically have the transistors arranged in two generally parallel rows. With such known arrangements using vertical transistors, SRAM cells having an area as small as 36 $F^2$ have been disclosed where F represents the smallest possible feature size that can be achieved with an available technology. U.S. Pat. No. 6,882, 007 to Landgraf et al, which is incorporated by reference, discloses such SRAM cells.

Figure 5:
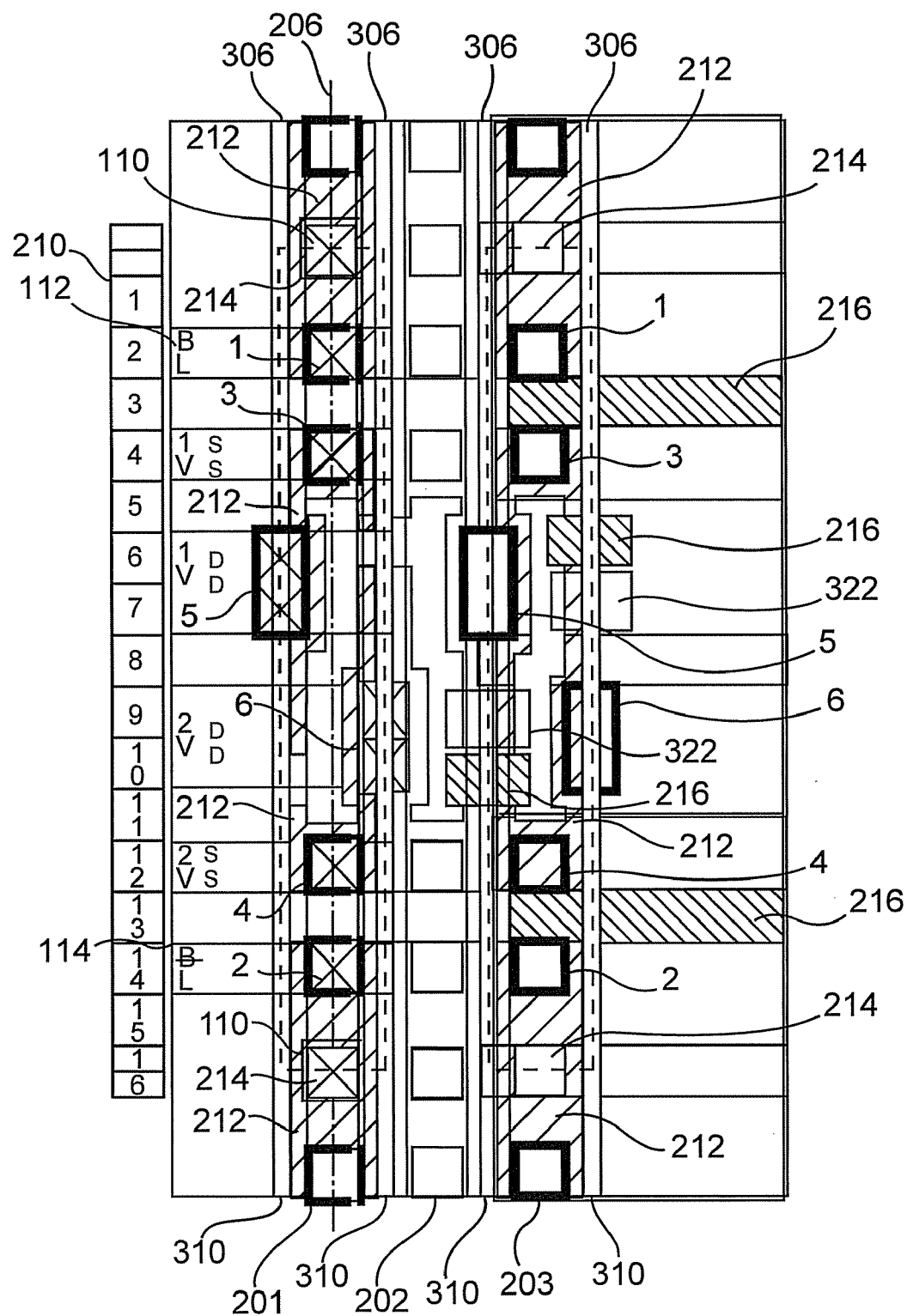
FIG. 5 illustrates portions of an SRAM device in accordance with embodiments of the present invention.

FIG. 5 illustrates portions of an SRAM device 200 in accordance with embodiments of the present invention. Portions of three neighboring SRAM cells 201,202,203 are illustrated, but for clarity, all mask layers are not shown in each cell. The illustrated arrangement provides a six-transistor SRAM cell with 32 $F^2$ or less area consumption (the $F^2$ scale is shown at reference 210 in FIG. 5 along the left side of the figure). The six transistors of the memory cell are generally arranged in a line. More specifically, each of memory cells 201,202,203 defines a longitudinal axis 206 (up and down the page as illustrated in FIG. 5), upon which four of the transistors (the NMOS transistors 1,2,3,4 in the illustrated embodiment) are centered such that they are "in-line." As shown in FIGS. 2 and 3, the two of the in-line transistors 1,2 are connected as switching transistors, and the other two 3,4 are connected as flip-flop transistors. The remaining two transistors (the PMOS transistors 5, 6 in the illustrated embodiment) are each symmetrically off-set from the longitudinal axis 206. In other words, the first PMOS transistor 5 is off-set to one side of the axis 206 and the second PMOS transistor 6 is off-set to the other side of the axis 206 (for example, the left and right sides, respectively, in cell 201). As shown in FIGS. 2 and 3, the PMOS transistors 5,6 are connected as flip-flop transistors.

Trenches 306, filled with cell-cell isolation material 310 that extends above the respective trenches to form an isolator "wall," separate the cells 201,202,203 from one another. Word lines 110 and bit lines 112, as well as the first and second $V_{DD}$ terminals ($V_{DD,1}$ and $V_{DD,2}$) and the first and second $V_{SS}$ terminals ($V_{SS,1}$ and $V_{SS,2}$) are connected to the various terminals of the transistors as shown in FIG. 3. The crossed lines, or "X" pattern indicates metal contacts.

Generally, PMOS and NMOS transistors do not provide equal performance for a given drive current. Accordingly, in the exemplary cells, the PMOS transistors 5,6 are shown larger than the NMOS transistors (2 $F^2$ vs. 1 $F^2$) to compensates for typically stronger NMOS transistors, which are about typically about two times stronger for a given drive current. If a particular design allows for weaker PMOS transistors, their size can be reduced, in turn further reducing the size of the over-all device. The PMOS transistors 5,6 are "shared" between adjacent cells, and as such, they are positioned over the filled trenches 306 on either side of the spacer material 310. Thus, the PMOS transistor 6 situated over the trench 306 between cells 201 and 202 functions as one of the PMOS flip-flop transistors for both cells 201 and 202.

Interconnect openings 322 are provided to connect the PMOS transistors 5,6 in the manner shown in FIG. 3 using conductive-spacer material 212 such as polycrystalline silicon (Poly-Si), for example, as an interconnect. A mask 216 defines an opening 330 (shown in FIG. 18) which creates interrupts in the conductive spacer material 212. Gate masks 214 are shown on the word lines 110, and the gate-spacer patterning 216 is provided as shown only in the third cell 203 for simplicity. As shown in the third cell 203, the gate-spacer is provided between NMOS transistors 2 and 4 and 1 and 3, and across from the PMOS transistors 5 and 6. The gate material between transistors must be properly interrupted by the gate-spacer 216 to avoid short circuits. As shown in the third cell 203, the gate-spacer is also interrupted between the NMOS transistors 2 and 4 and 1 and 3 by the mask 216, and across from the PMOS transistors 5 and 6 by the following spacer etch. The gate material between transistors must be properly interrupted by etching the gate-spacer in region 216 to avoid short circuits.

As noted above in conjunction with FIG. 3, the exemplary embodiment illustrated includes first and second $V_{DD}$ terminals and first and second $V_{SS}$ terminals. This allows "fine-tuning" of the supply voltages provided to each side of the SRAM latch. This allows adjustments to compensate for process variations. For example, as noted above, the PMOS transistor structure 5,6 are shared between neighboring cells. If a particular PMOS transistor is not exactly centered over the filled trench 306, a weaker transistor could be provided in one cell with a stronger transistor in the adjacent cell.

Figure 6:
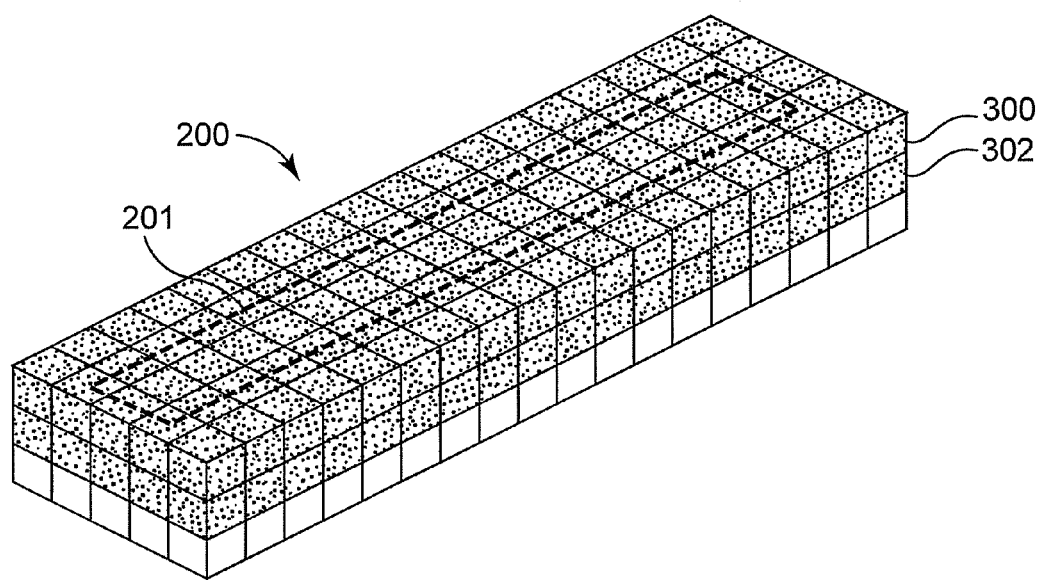
FIGS. 6-20 are perspective views illustrating an exemplary embodiment of an SRAM memory device in various stages of manufacture.

FIGS. 6-20 illustrate an exemplary embodiment of the SRAM memory device 200 in various stages of manufacture. As shown in FIG. 6, the device 200 includes a silicon on insulator (SOI) substrate including a silicon layer 300 and a buried oxide layer 302. Alternatively, a convention bulk silicon wafer could be used, though additional well layers may be required to isolate the SRAM cells. Still further embodiments are envisioned in which a bulk or SOI wafer with additional (in-situ doped) selective epitaxial growth (SEG) layers. The dashed line generally illustrates the base area of the memory cell 200, which is about 2 F wide and 15-16 F long, resulting in a 32 $F^2$ or smaller SRAM cell (F is the minimum feature size).

Figure 7:
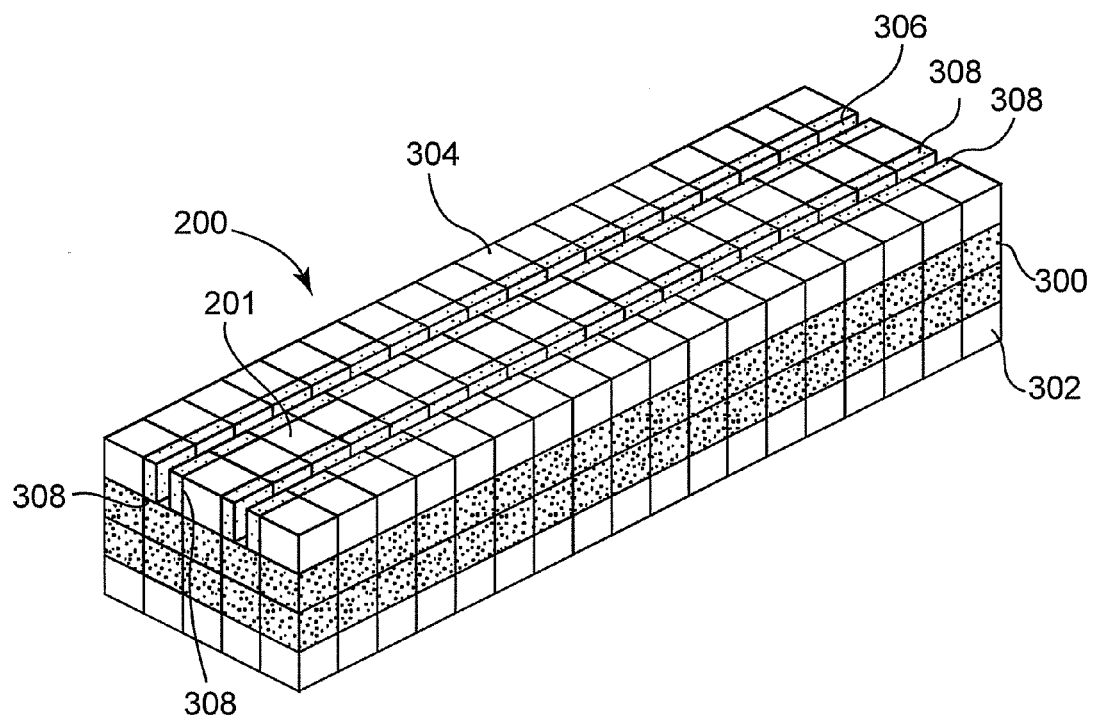
Figure 8:
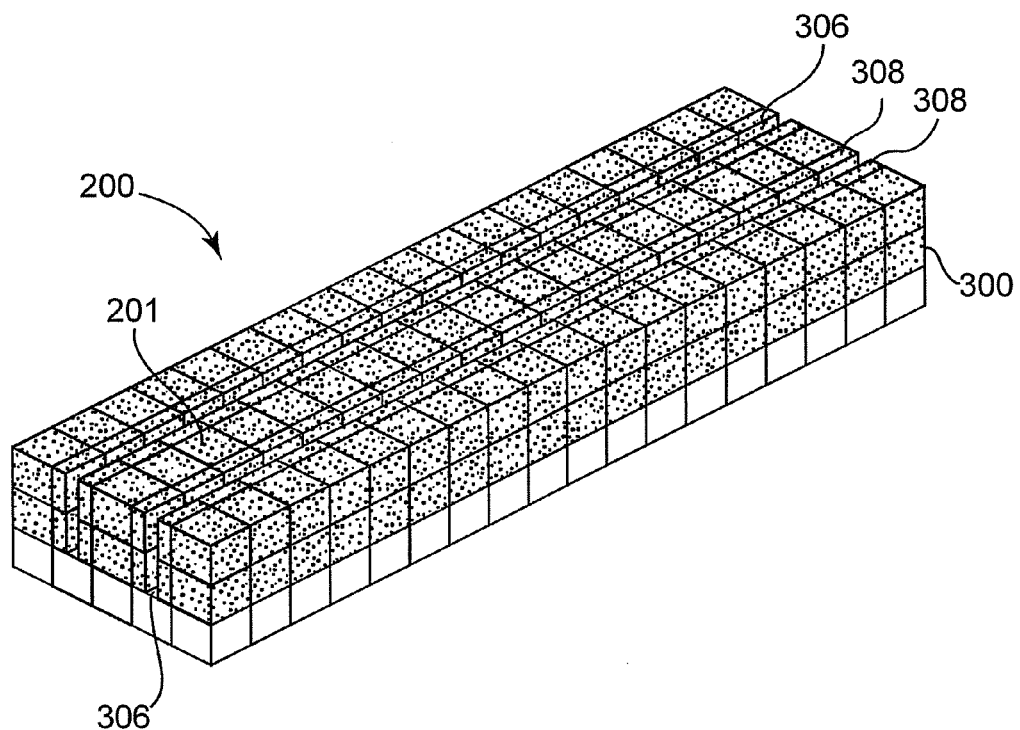
Figure 9:
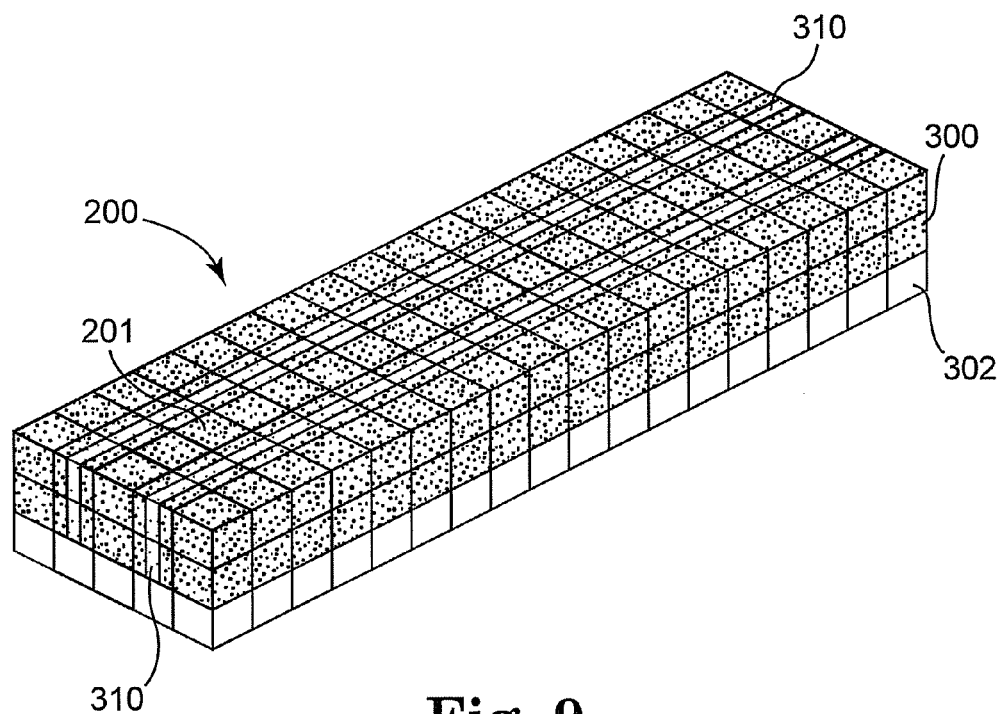

FIG. 7 illustrates portions of the trench mask patterning process. This includes deposition and patterning of a hardmask layer 304 and trenches 306, and creation of additional sidewall spacers 308 to reduce the thickness of the trenches 306. The trenches 306 need to be robust to provide the required isolation between cells, but trenches 306 that are formed too wide use excess device area. As illustrated in FIG. 8, the trenches 306 are etched into the silicon layer 300 and the hardmask 304 and sidewall spacers 308 are removed. The trenches 306 are filled with a cell-cell isolation material 310 as shown in FIG. 9. The isolation material 310 can be any suitable non-conducting but hard to etch material, such as (amorphous) carbon or condensed nitride with polymer cover. The fill material can be sputtered or deposited and then removed by chemical-mechanical planarization (CMP) if needed. In exemplary embodiments, the initial hardmask 304 and sidewall spacers 308 are used as CMP etch stop layer and are removed after the trench filling.

Figure 10:
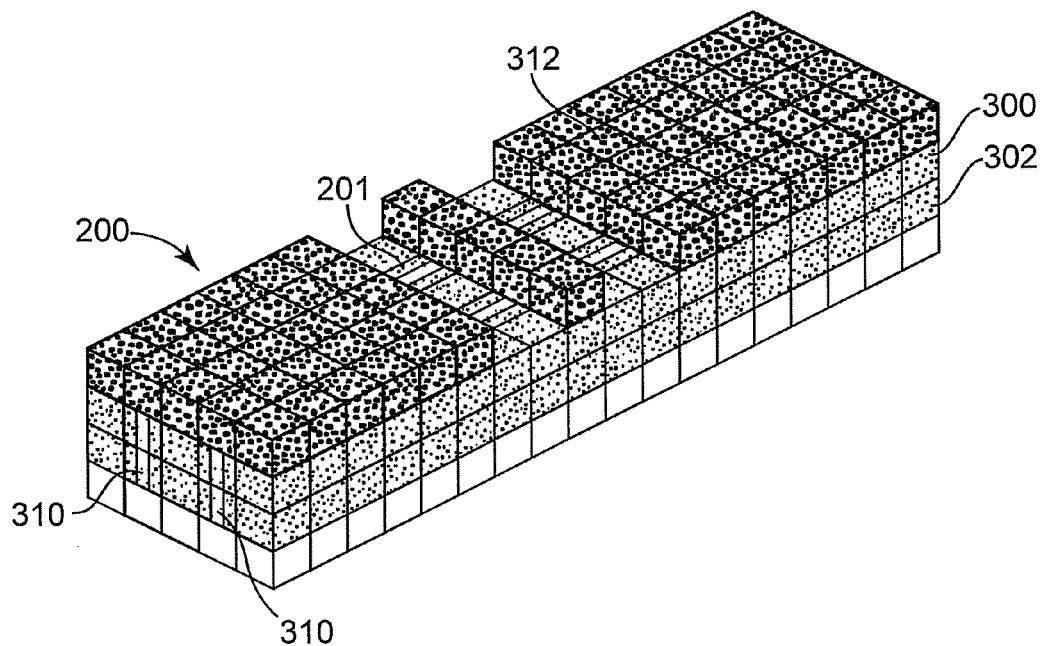
Figure 11:
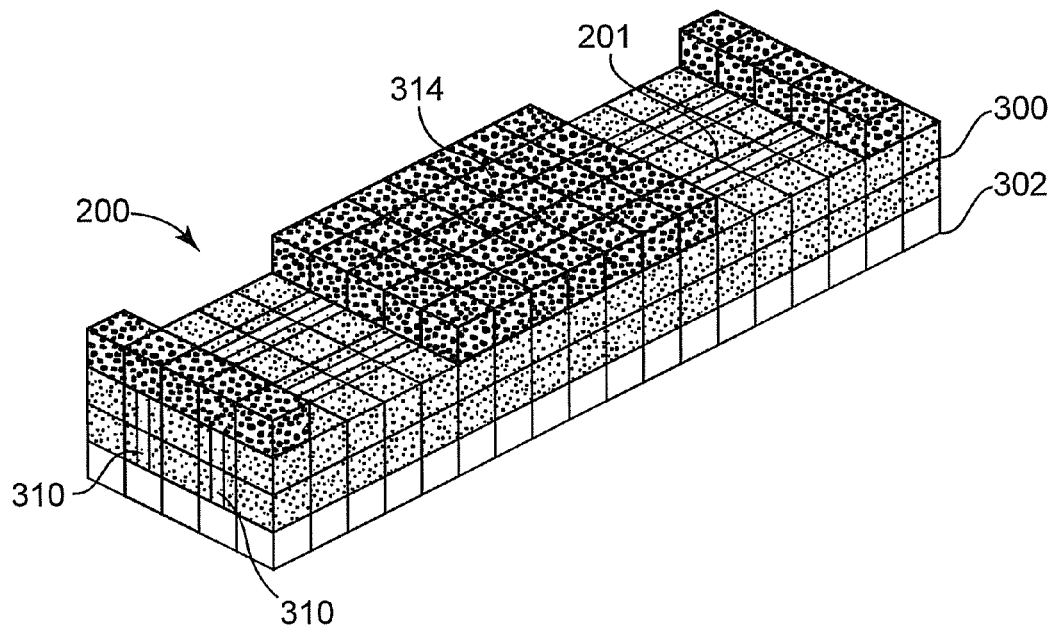
Figure 12:
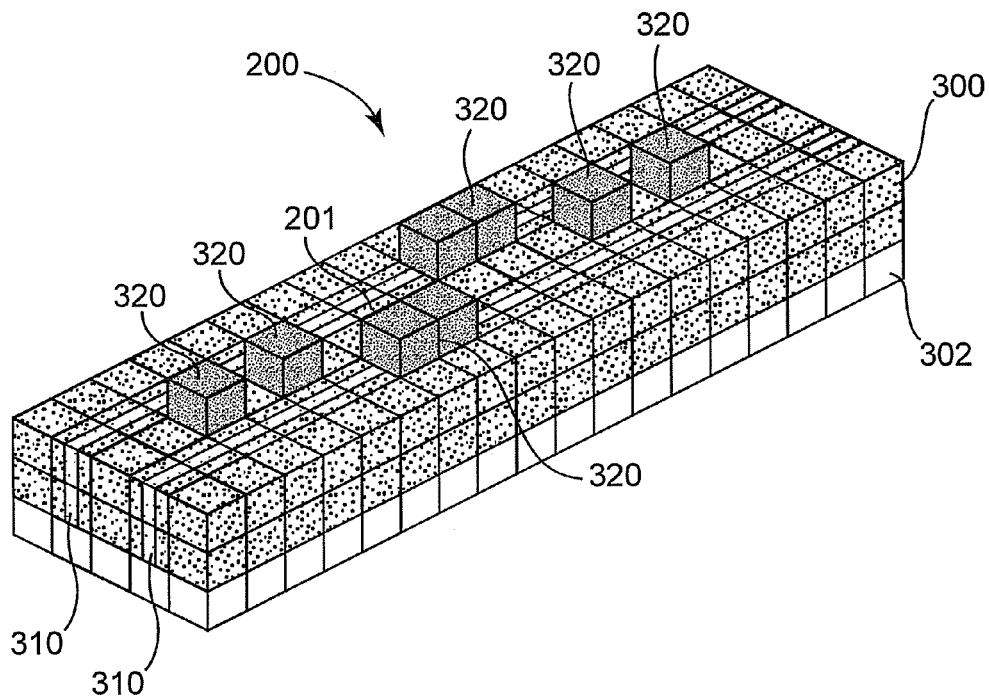
Figure 13:
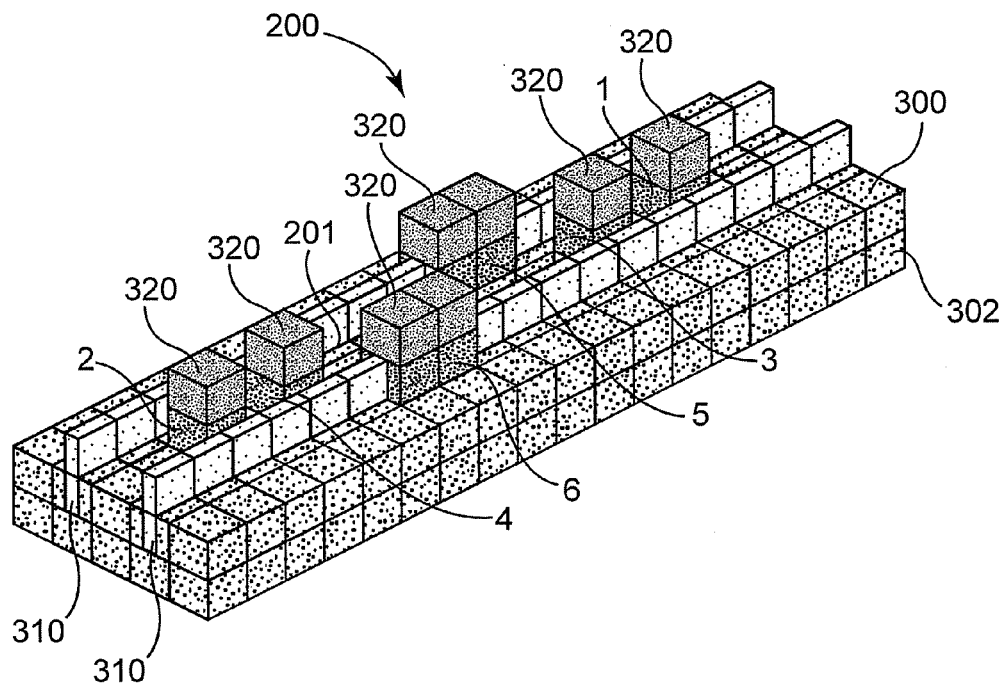
Figure 14:
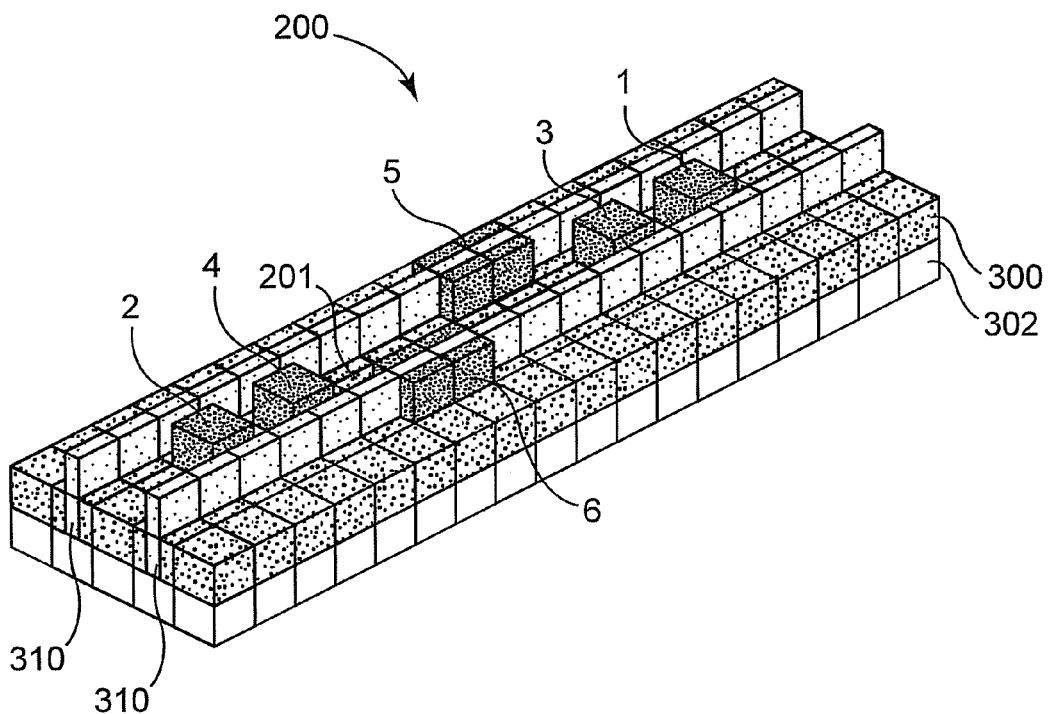

In FIGS. 10 and 11, resist masks 312, 314 are provided for the subsequent implantation of the source and drain terminals of the PMOS and NMOS transistors, respectively. A hardmask 320 is deposited and patterned for the NMOS transistors 1,2,3,4 and the PMOS transistors 5,6 as illustrated in FIG. 12. In FIG. 13, the device 200 is illustrated with the silicon etched, showing the positions of the NMOS transistors 1,2, 3,4 and PMOS transistors 5,6, and in FIG. 13 the hardmask 320 has been removed (if it was not consumed during the etching process). As noted above in conjunction with FIG. 5, the hardmask of the PMOS transistors 5,6 are "shared" between adjacent cells, with each of the PMOS transistors 5,6 separated by the fill material 310. Thus, the blocks showing the PMOS transistors 5,6 locations illustrated in FIG. 13 actually form the two PMOS transistors for the cell 201 and additionally, one of the PMOS transistors for each of the adjacent cells. Accordingly, the PMOS transistors 5,6 are generally centered over the respective filled trench 306 such that approximately an equal amount of area of each of the PMOS transistors 5,6 is on either side of the trench 306, with the fill material 310 separating the transistors. As illustrated in FIG. 13, for example, the PMOS transistors 5,6 are each 1 F wide and centered over the isolation material 310 filling the trench 306. Hence, about ⅓ F of the each of the PMOS transistor's width is in the cell 201, with about ⅓ F in the adjacent cells and about ⅓ F over the trench 306. If necessary, the device 200 can be fabricated such that the PMOS transistors are wider than 1 F to facilitate positioning equally in adjacent cells.

Figure 15:
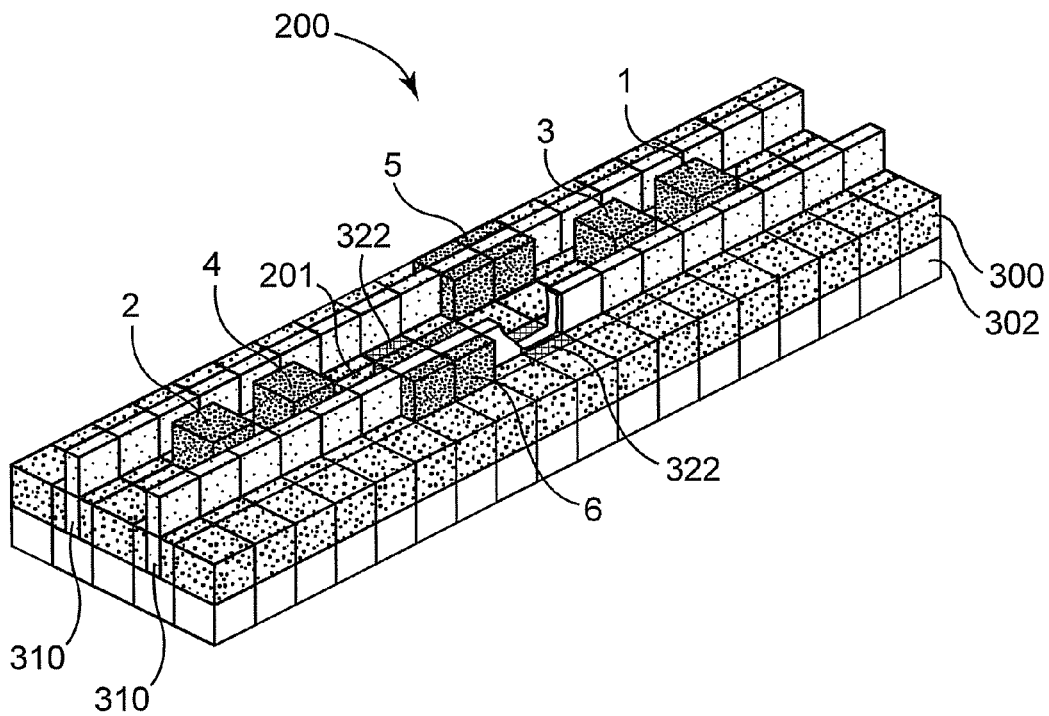
Figure 16:
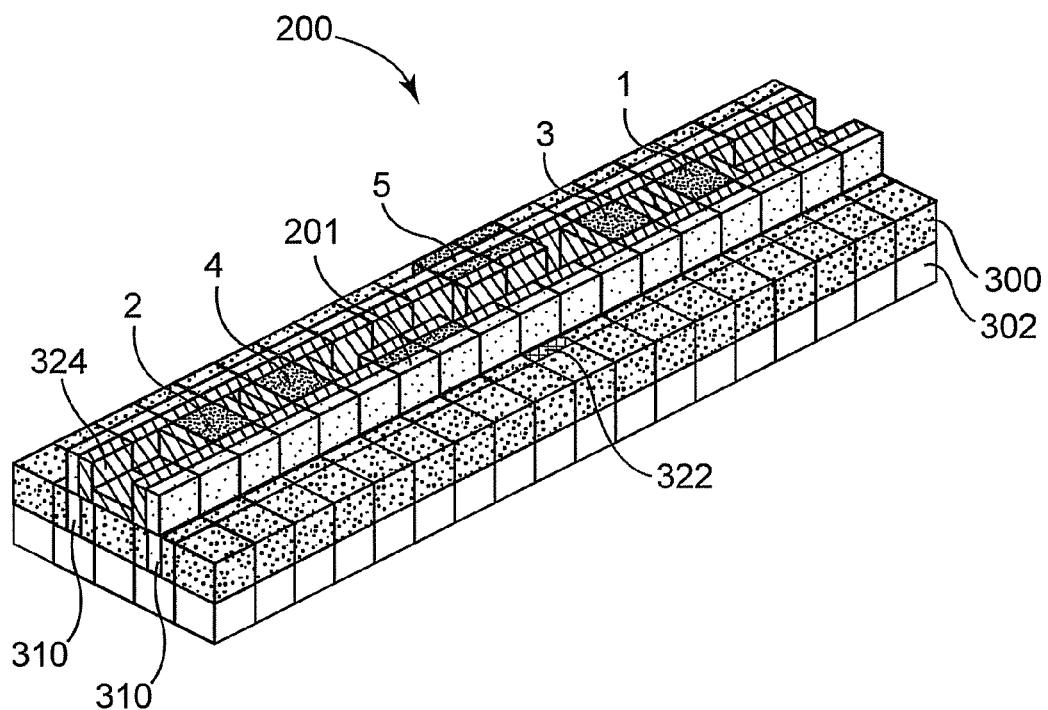
Figure 17:
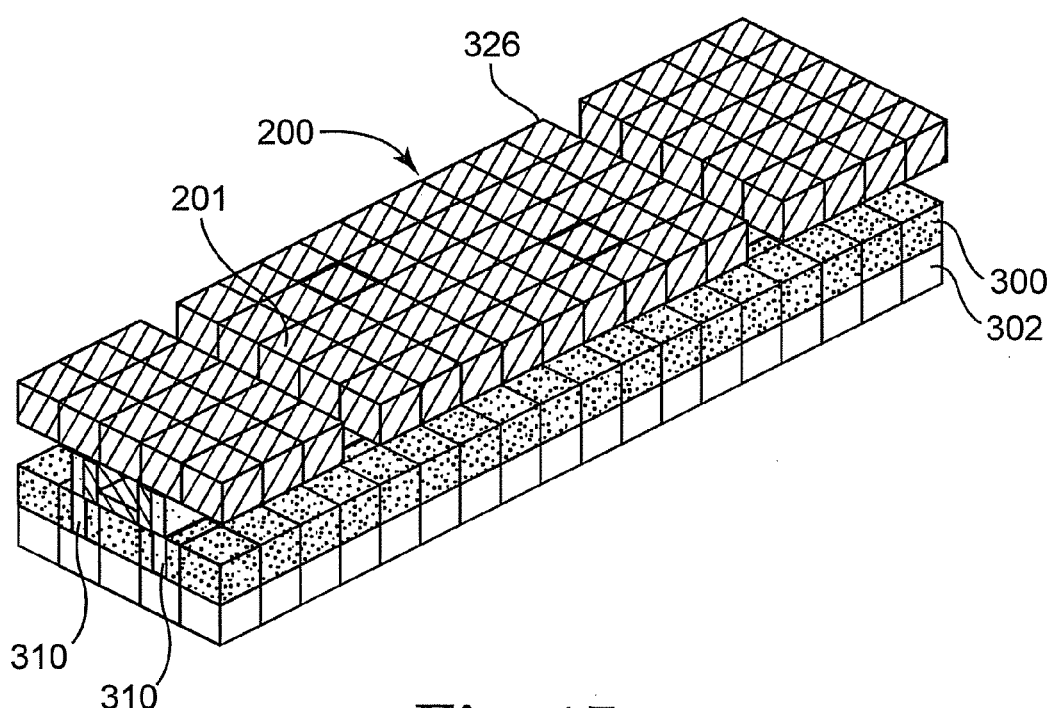
Figure 18:
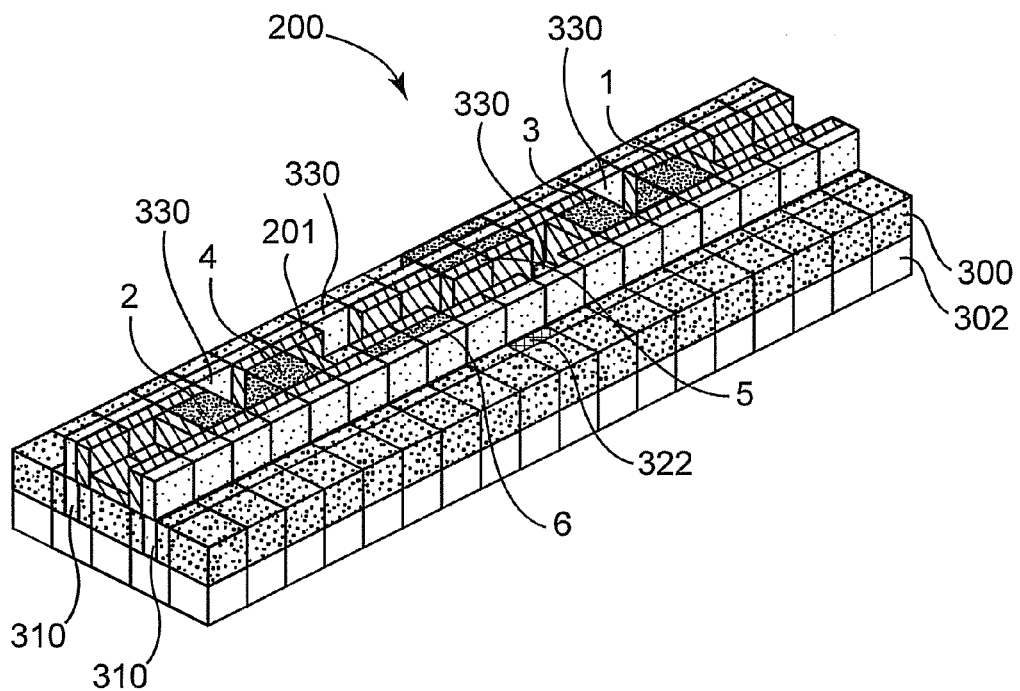

FIG. 15 illustrates the device 200 after depositing of the dielectric. Portions of the cell-cell isolation material 310 have been omitted in the drawing to show areas where the dielectric has been removed to form interconnects 322 that cross-connect the PMOS transistors 5 and 6. The interconnects 322 may be formed, for example, by implanting germanium, carbon or some other heavy ion or metal to destroy the isolator or convert it to a conductor. Deposition and patterning of the gate material 324 is shown in FIG. 16, and in FIG. 17, the device is illustrated having a resist mask 326 for gate-spacer patterning. The gate material 324 is etched (interrupted) between the NMOS transistors 2 and 4 and 1 and 3, and across from the PMOS transistors 5 and 6. FIG. 18 illustrates the device 200 after the gate-spacer etching, showing the separation 330 between transistors.

Figure 19:
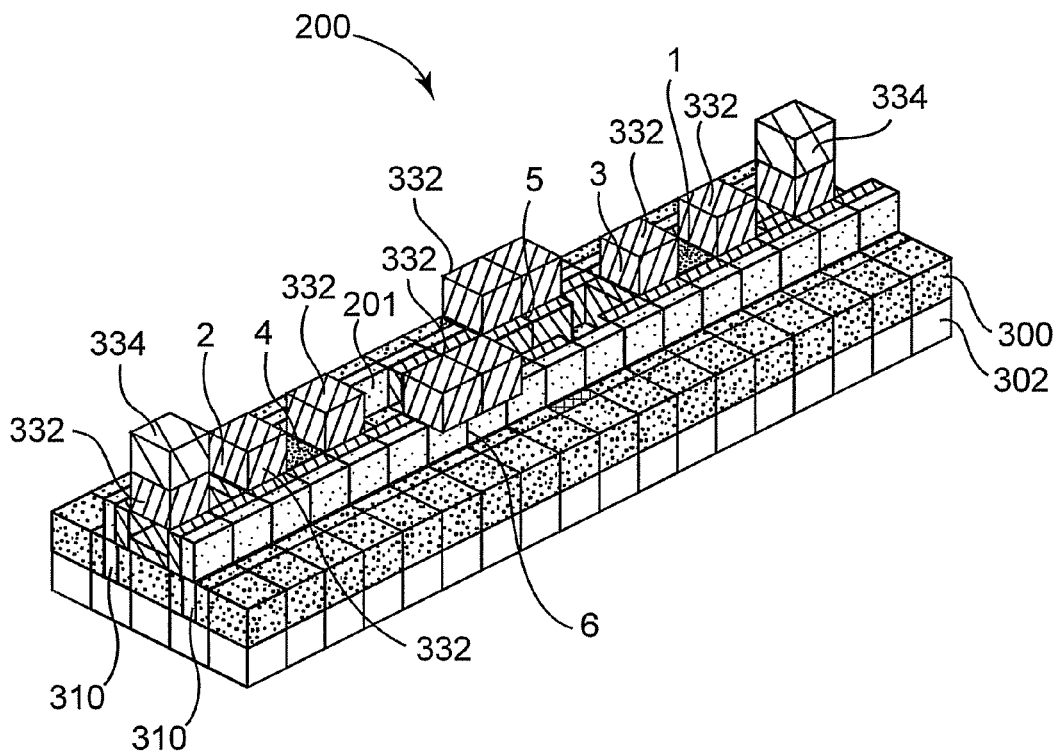
Figure 20:
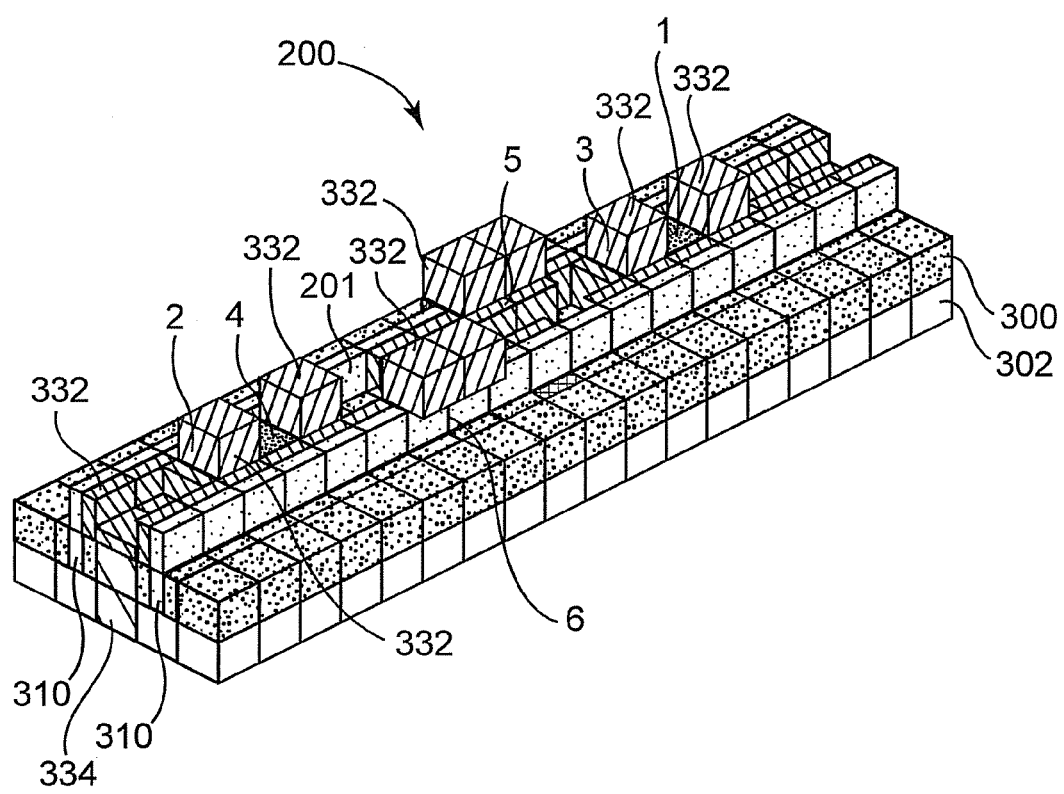

In FIG. 19, an essentially conventional backend process is shown, wherein metal contacts are added. A first metal 332 is used for the $V_{SS}$, $V_{DD}$ and bit line terminals, and a second metal 334 is used for the word line. FIG. 20 illustrates an alternative backend process in which the first metal 332 is used for the $V_{SS}$, $V_{DD}$ and bit lines essentially as shown in FIG. 19, but the second metal 334 for the word line is realized as a backside contact through the buried oxide. This leaves more space for wiring of the first metal 332 on the top side, or alternatively, the cell size can be reduced from 32 $F^2$ to 30 $F^2$. Further embodiments are envisioned in which the width of the PMOS transistors 5, 6 is reduced, resulting in a sub-30 $F^2$ SRAM cell area.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
   a base area defining a longitudinal axis;
   four in-line transistors, the in-line transistors each being centered on the longitudinal axis;
   two off-set transistors, one of the off-set transistors being off-set to a first side of the longitudinal axis and the other of the off-set transistors being off-set to a second side of the longitudinal axis; and
   poly-spacer material separating the transistors.

2. The integrated circuit device of claim 1, wherein the in-line transistors are NMOS transistors.

3. The integrated circuit device of claim 1, wherein the off-set transistors are PMOS transistors.

4. The integrated circuit device of claim 1, wherein the transistors are vertical transistors.

5. The integrated circuit device of claim 1, wherein two of the in-line transistors are connected as switching transistors.

6. The integrated circuit device of claim 5, wherein the in-line transistors connected as switching transistors each include a gate terminal, the integrated circuit device further including a word line connected to the gate terminals.

7. The integrated circuit device of claim 6, wherein the in-line transistors connected as switching transistors each include a first source/drain terminal, the integrated circuit device further including first and second bit lines connected to respective ones of the first source/drain terminals.

8. The integrated circuit device of claim 7, wherein:
   the remaining in-line transistors and the off-set transistors are connected as flip-flop transistors, each of the flip-flop transistors having a gate terminal and first and second drain/source terminals;
   the switching transistors each include a second source/drain terminal;
   the second source/drain terminal of a first one of the switching transistors is connected to the first source/drain terminals of a first one of the in-line flip-flop transistors and a first one of the off-set flip-flop transistors, and also to the gate terminals of a second one of the in-line flip-flop transistors and a second one of the off-set flip-flop transistors; and
   the second source/drain terminal of a second one of the switching transistors is connected to the first source/drain terminals of the second one of the in-line flip-flop transistors and the second one of the off-set flip-flop transistors, and also to the gate terminals of the first one of the in-line flip-flop transistors and the first one of the off-set flip-flop transistors.

9. The integrated circuit device of claim 1, wherein two of the in-line transistors are connected as flip-flop transistors.

10. The integrated circuit device of claim 9, further comprising a first $V_{SS}$ terminal connected to a drain/source terminal of one of the in-line flip-flop transistors and a second $V_{SS}$ terminal connected to a drain/source terminal of the other of the in-line flip-flop transistors.

11. The integrated circuit device of claim 1, wherein the off-set transistors are connected as flip-flop transistors.

12. The integrated circuit device of claim 1, further comprising a first $V_{DD}$ terminal connected to a drain/source terminal of one of the off-set transistors and a second $V_{DD}$ terminal connected to a drain/source terminal of the other of the offset transistors.

13. The integrated circuit device of claim 1, wherein the base area is defined on a substrate.

14. The integrated circuit device of claim 13, wherein the substrate comprises a silicon on insulator (SOI) substrate.

15. A memory device, comprising:
a substrate;
a plurality of memory cells situated in a base area of the substrate, the base area defining a plurality of longitudinal axes corresponding to each of the memory cells, each of the memory cells including:
first, second, third and fourth NMOS transistors, each being centered on the longitudinal axis, each including first and second source/drain terminals and a gate terminal;
a first PMOS transistor being off-set to a first side of the longitudinal axis, the first PMOS transistor including first and second source/drain terminals and a gate terminal;
a second PMOS transistor being off-set to a second side of the longitudinal axis, the second PMOS transistor including first and second source/drain terminals and a gate terminal;
a word line connected to the gate terminals of the first and second NMOS transistors;
a first bit line connected to the first source/drain terminal of the first NMOS transistor;
a second bit line connected to the first source/drain terminal of the second NMOS transistor;
the gate terminals of the third NMOS transistor and the first PMOS transistor being connected to the second source/drain terminals of the second NMOS transistor, the second PMOS transistor and the fourth NMOS transistor;
the gate terminals of the fourth NMOS transistor and the second PMOS transistor being connected to the second source/drain terminals of the first NMOS transistor, of the first PMOS transistor and the third NMOS transistor;
the first source/drain terminals of the first and second PMOS transistors being connected to a first voltage potential; and
the first source/drain terminals of the third and fourth NMOS transistors being connected to a second voltage potential;
wherein adjacent cells share one of the PMOS transistors.

16. The memory device of claim 15, wherein the memory cells are separated by a trench filled with cell isolation material.

17. The memory device of claim 16, wherein each of the PMOS transistors are generally centered over one of the trenches.

18. The memory device of claim 15, wherein the transistors are vertical transistors.

19. The memory device of claim 15, wherein the first source/drain terminal of the first PMOS transistor is connected to a first $V_{DD}$ terminal and the first source/drain terminal of the second PMOS transistor is connected to a second $V_{DD}$ terminal.

20. The memory device of claim 15, wherein the first source/drain terminal of the third NMOS transistor is connected to a first $V_{SS}$ terminal and the first source/drain terminal of the fourth NMOS transistor is connected to a second $V_{SS}$ terminal.

21. The memory device of claim 15, wherein the substrate comprises a silicon on insulator (SOI) substrate.

22. The memory device of claim 15, further comprising poly-spacer material separating the transistors.

23. A system, comprising:
a host device;
a memory coupled to the host device, the memory comprising:
a substrate;
a plurality of memory cells situated in a base area of the substrate, the base area defining a plurality of longitudinal axes corresponding to the memory cells, each of the memory cells being separated by a trench filled with cell isolation material and including:
first, second, third and fourth NMOS transistors, each being centered on the longitudinal axis, each including first and second source/drain terminals and a gate terminal;
a first PMOS transistor being off-set to a first side of the longitudinal axis, the first PMOS transistor including first and second source/drain terminals and a gate terminal;
a second PMOS transistor being off-set to a second side of the longitudinal axis, the second PMOS transistor including first and second source/drain terminals and a gate terminal;
a word line connected to the gate terminals of the first and second NMOS transistors;
a first bit line connected to the first source/drain terminal of the first NMOS transistor;
a second bit line connected to the first source/drain terminal of the second NMOS transistor;
the gate terminals of the third NMOS transistor and the first PMOS transistor being connected to the second source/drain terminals of the second NMOS transistor, the second PMOS transistor and the fourth NMOS transistor;
the gate terminals of the fourth NMOS transistor and the second PMOS transistor being connected to the second source/drain terminals of the first NMOS transistor, of the first PMOS transistor and the third NMOS transistor;
the first source/drain terminals of the first and second PMOS transistors being connected to a first voltage potential; and
the first source/drain terminals of the third and fourth NMOS transistors being connected to a second voltage potential;
wherein each of the PMOS transistors are generally centered over one of the trenches.

24. The system of claim 23, wherein adjacent cells share one of the PMOS transistors.

25. The system of claim 23, wherein the transistors are vertical transistors.

26. The system of claim 23, wherein the first source/drain terminal of the first PMOS transistor is connected to a first $V_{DD}$ terminal and the first source/drain terminal of the second PMOS transistor is connected to a second $V_{DD}$ terminal.

27. The system of claim 23, wherein the first source/drain terminal of the third NMOS transistor is connected to a first $V_{SS}$ terminal and the first source/drain terminal of the fourth NMOS transistor is connected to a second $V_{SS}$ terminal.

28. The system of claim 23, wherein the substrate comprises a silicon on insulator (SOI) substrate.

29. The system of claim 23, further comprising poly-spacer material separating the transistors.

30. A memory device, comprising:
first, second, third and fourth NMOS transistors, each including first and second source/drain terminals and a gate terminal;
first and second PMOS transistors, each including first and second source/drain terminals and a gate terminal;
poly-spacer material separating the transistors;
a word line connected to the gate terminals of the first and second NMOS transistors;
a first bit line connected to the first source/drain terminal of the first NMOS transistor;
a second bit line connected to the first source/drain terminal of the second NMOS transistor;
the gate terminals of the third NMOS transistor and the first PMOS transistor being connected to the second source/drain terminals of the second NMOS transistor, the second PMOS transistor and the fourth NMOS transistor;
the gate terminals of the fourth NMOS transistor and the second PMOS transistor being connected to the second source/drain terminals of the first NMOS transistor, of the first PMOS transistor and the third NMOS transistor;
the first source/drain terminal of the first PMOS transistor being connected to a first $V_{DD}$ terminal;
the first source/drain terminal of the second PMOS transistor being connected to a second $V_{DD}$ terminal;
the first source/drain terminal of the third NMOS transistor being connected to a first $V_{SS}$ terminal; and
the first source/drain terminal of the fourth NMOS transistor being connected to a second $V_{SS}$ terminal.

31. The memory device of claim 30, further comprising a substrate, wherein:
the memory cell is situated in a base area of the substrate defining a longitudinal axis;
the first, second, third and fourth NMOS transistors are each centered on the longitudinal axis;
the first PMOS transistor is off-set to a first side of the longitudinal axis; and
the second PMOS transistor is off-set to a second side of the longitudinal axis.

* * * * *